US009680276B2

(12) United States Patent
Hansen

(10) Patent No.: US 9,680,276 B2
(45) Date of Patent: Jun. 13, 2017

(54) VISION ENHANCEMENT ILLUMINATORS

(71) Applicant: Sensors Unlimited, Inc., Princeton, NJ (US)

(72) Inventor: Marc Hansen, Hamilton, NJ (US)

(73) Assignee: Sensors Unlimited, Inc., Princeton, NJ (US)

(*) Notice: Subject to any disclaimer, the term of this patent is extended or adjusted under 35 U.S.C. 154(b) by 479 days.

(21) Appl. No.: 14/186,036

(22) Filed: Feb. 21, 2014

(65) Prior Publication Data

US 2015/0155676 A1    Jun. 4, 2015

Related U.S. Application Data

(60) Provisional application No. 61/910,662, filed on Dec. 2, 2013.

(51) Int. Cl.
    *G02B 5/02*     (2006.01)
    *H01S 3/00*     (2006.01)
    *H01L 25/16*    (2006.01)
    *G02B 27/09*    (2006.01)
    *F41G 1/35*     (2006.01)

(52) U.S. Cl.
    CPC .......... *H01S 3/0078* (2013.01); *G02B 5/0278* (2013.01); *G02B 27/0927* (2013.01); *G02B 27/0938* (2013.01); *H01L 25/167* (2013.01); *F41G 1/35* (2013.01); *H01L 2924/0002* (2013.01)

(58) Field of Classification Search
    CPC ................. H01S 3/0078; H01L 25/167; H01L 2924/0002; F41G 1/35; G02B 5/0078; G02B 27/0278; G02B 27/0927
    See application file for complete search history.

(56) References Cited

U.S. PATENT DOCUMENTS

| | | | |
|---|---|---|---|
| 6,714,564 B1* | 3/2004 | Meyers | F41G 1/35 359/727 |
| 2004/0008410 A1* | 1/2004 | Stam | B60R 1/062 359/443 |
| 2008/0240199 A1 | 10/2008 | Drolshagen et al. | |

(Continued)

OTHER PUBLICATIONS

Michael MacDougal et. al., Wide Area SWIR Arrays and Active Illuminators, Jan. 21, 2012,Proc. of SPIE, vol. 82682.*

(Continued)

*Primary Examiner* — Scott J Sugarman
*Assistant Examiner* — Robert E Tallman
(74) *Attorney, Agent, or Firm* — Locke Lord LLP; Scott D. Wofsy; Alicia J. Carroll

(57) ABSTRACT

An illuminator includes a short wave infrared (SWIR) laser, a lens collimator, a first beam shaping diffuser, a second beam shaping diffuser, and a bandpass filter. The lens collimator is optically coupled to the laser for diverging a beam emitted by the laser. The first beam shaping diffuser is optically coupled to the lens collimator to diffuse a diverged beam produced by the lens collimator. The second beam shaping diffuser is optically coupled to the first beam shaping diffuser to further diffuse a diffused beam produced by the first beam shaping diffuser. The bandpass filter is optically connected to the second beam shaping diffuser configured to filter the emissions of a further diffused beam produced by the second beam shaping diffuser.

15 Claims, 3 Drawing Sheets

(56) References Cited

U.S. PATENT DOCUMENTS

2009/0207467 A1    8/2009  Meyers et al.
2012/0080411 A1*   4/2012  Mizuyama ............ G02B 27/48
                                                   219/121.6

OTHER PUBLICATIONS

MacDougal et al., "Wide Area SWIR Arrays and Active Illuminators", Proc. of SPIE, vol. 8268, 82682Y-1, 2012, 8 pages.
Extended European Search Report and Written Opinion dated Apr. 24, 2015, issued on corresponding European Patent Application No. 14195784.5 (6 pages).

* cited by examiner

VISION ENHANCEMENT ILLUMINATORS

CROSS-REFERENCE TO RELATED APPLICATIONS

This application claims priority to U.S. Provisional Patent Application No. 61/910,662 filed Dec. 2, 2013, which is incorporated by reference herein in its entirety.

BACKGROUND OF THE INVENTION

1. Field of the Invention

The present invention relates to illuminators, and, in particular, to imaging systems with illuminators for vision enhancement.

2. Description of Related Art

Traditional illuminators are used for vision enhancement, e.g. driver vision enhancement, while driving in low light conditions. Generally, they include large banks of light emitting diodes (LEDs). LEDs tend to be inefficient, bulky and have illumination range limitations due to foreground backscatter.

There are other methods and devices for vision enhancement while driving or operating in low light conditions, such as thermal imaging and image intensification ($I^2$).

Such conventional methods and systems have generally been considered satisfactory for their intended purpose. However, there is still a need in the art for systems and methods that allow for improved vision enhancement. The present invention provides a solution for these problems.

SUMMARY OF THE INVENTION

An illuminator includes a short wave infrared (SWIR) laser, a lens collimator, a first beam shaping diffuser, a second beam shaping diffuser, and a bandpass filter. The lens collimator is optically coupled to the laser for diverging a beam emitted by the laser. The first beam shaping diffuser is optically coupled to the lens collimator to diffuse a diverged beam produced by the lens collimator. The second beam shaping diffuser is optically coupled to the first beam shaping diffuser to further diffuse a diffused beam produced by the first beam shaping diffuser. The bandpass filter is optically connected to the second beam shaping diffuser configured to filter the emissions of a further diffused beam produced by the second beam shaping diffuser.

It is also contemplated that the SWIR laser can be a 1550 nm SWIR laser and/or an edge emitting SWIR laser. The lens collimator can be a defocused fast-axis collimator lens configured to shape the beam of the SWIR laser into an eight degree divergence. The first beam shaping diffuser can be a 5 degree circular beam shaping diffuser. The second beam shaping diffuser can be configured to create a 90 degree horizontal by 40 degree vertical illumination field with a Gaussian distribution centered in the horizontal plane. The bandpass filter can be a 1550 nm bandpass filter configured to filter out all other wavelength emissions from the further diffused beam. The illuminator can also include an illuminator housing wherein the SWIR laser, the lens collimator, the first beam shaping diffuser and the second beam shaping diffuser can be mounted within the illuminator housing and the bandpass filter can be mounted within a wall of the illuminator housing.

In certain embodiments, a SWIR imaging system includes an illuminator, as described above, and an imager. The imager has a SWIR sensor configured to form an image of objects illuminated by the illuminator.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
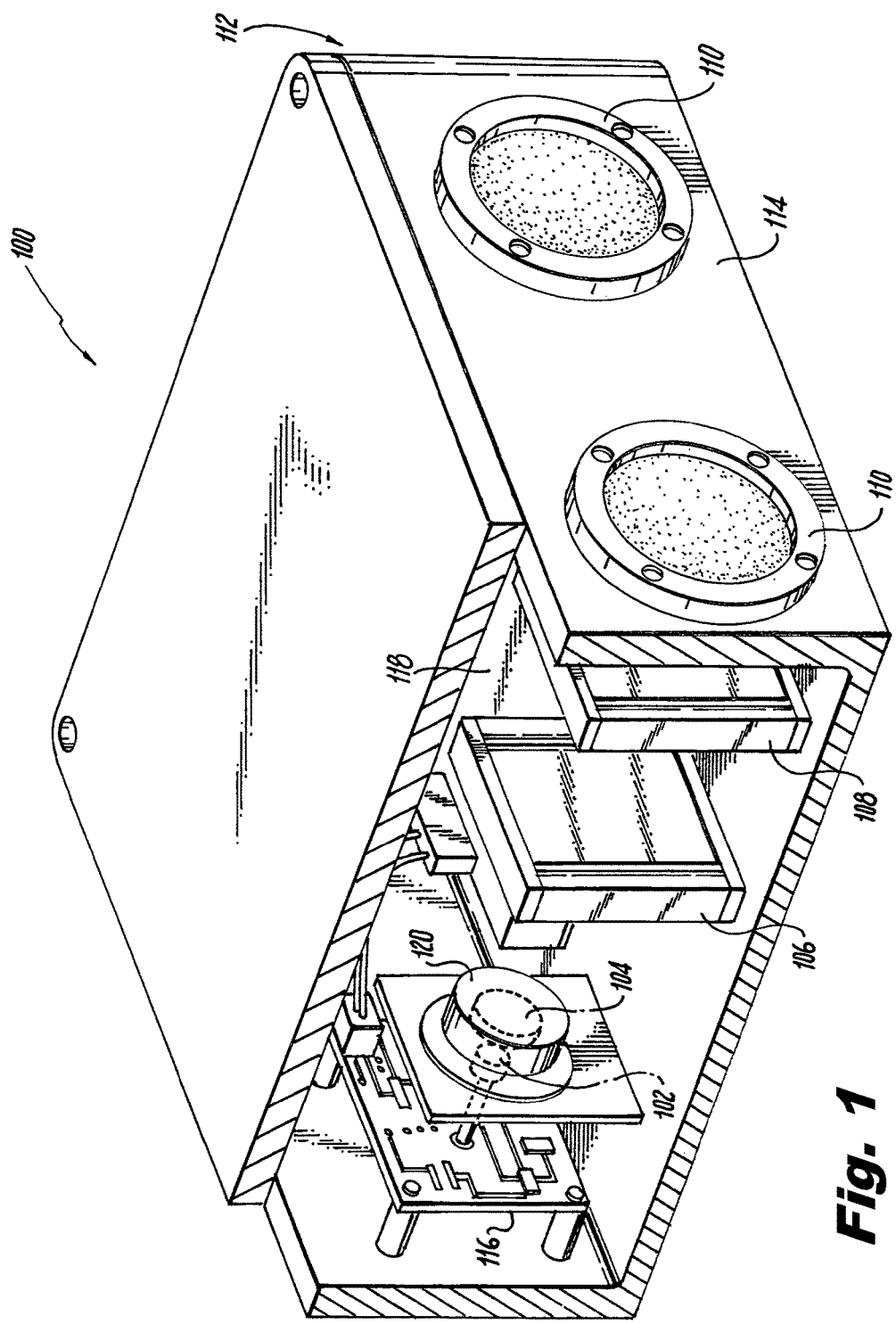
FIG. 1 is a cut-away perspective view of an exemplary embodiment of an illuminator constructed in accordance with the present disclosure, showing the SWIR laser, collimator, diffusers and bandpass filter.

Reference will now be made to the drawings wherein like reference numerals identify similar structural features or aspects of the subject disclosure. For purposes of explanation and illustration, and not limitation, a perspective view of an exemplary embodiment of the illuminator in accordance with the disclosure is shown in FIG. 1 and is designated generally by reference character 100. Other embodiments of illuminators in accordance with the disclosure, or aspects thereof, are provided in FIGS. 2-3, as will be described.

As shown in FIG. 1, an illuminator 100 includes a short wave infrared (SWIR) laser 102, a defocused lens collimator 104, a first beam shaping diffuser 106, a second beam shaping diffuser 108, and a bandpass filter 110. SWIR laser 102 is a 1550 nm edge emitting SWIR laser 102. First beam shaping diffuser 106 is a 5 degree circular beam shaping diffuser 106. Second beam shaping diffuser 108 is configured to create a 90 degree horizontal by 40 degree vertical illumination field with a Gaussian distribution centered in the horizontal plane, falling off vertically from its peak intensity in the middle of the ellipse. In other words, this means that the majority of the light is projected in the distance and the illumination field described above compensates for the inverse square distance reflectance dependency, e.g. the decreased reflective brightness of the return signal from an object farther away. In traditional illuminators, this inverse relationship tends to cause the near field to be much brighter than the far field, causing the image captured to have a bright near field image, but dark far field image.

Those skilled in the art will readily appreciate that, by compensating for the inverse square distance reflectance dependency, both the far field and the near field can have similar return signal brightness, yielding an image with consistent brightness over an increased range. Further, those skilled in the art will readily appreciate that this illumination field can allow illumination over an area ranging hundreds of meters from illuminator 100, while the imaging system, described below, can have reduced foreground backscatter as compared to traditional imaging systems.

With continued reference to FIG. 1, illuminator 100 has an illuminator housing 112 wherein SWIR laser 102, defocused lens collimator 104, circular beam shaping diffuser 106 and second beam shaping diffuser 108 are mounted within illuminator housing 112 and bandpass filter 110 is mounted within a wall 114 of illuminator housing 112. While a single SWIR laser 102, defocused lens collimator 104, circular beam shaping diffuser 106, and second beam shaping diffuser 108 are shown in FIG. 1, those skilled in the art will readily appreciate that there is another respective SWIR laser 102, defocused lens collimator 104, circular beam shaping diffuser 106, second beam shaping diffuser 108, and circuit board 116, not visible in FIG. 1, associated with and optically connected to the additional bandpass filter 110 shown on the right-hand side of FIG. 1.

Figure 2:
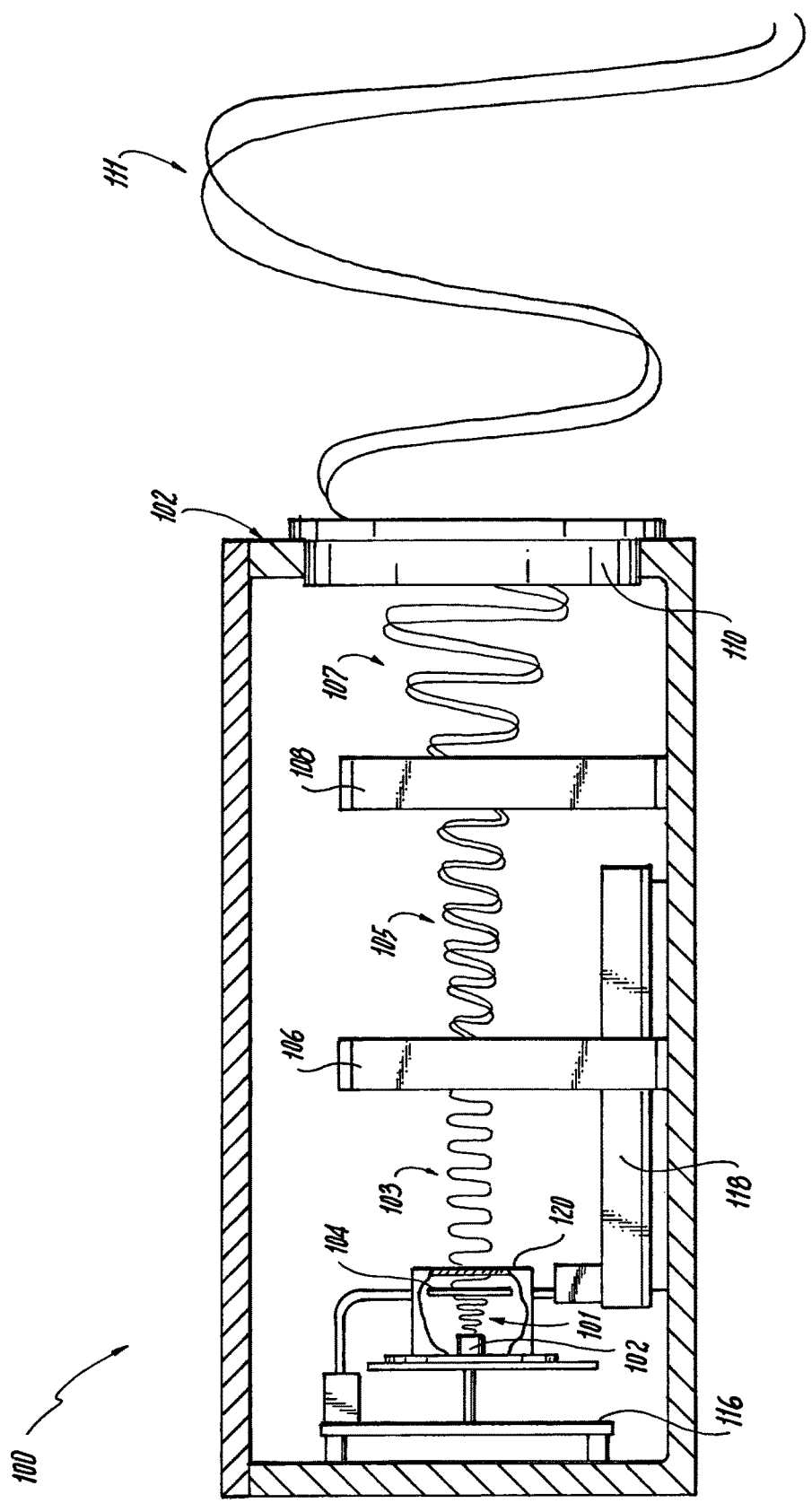
FIG. 2 is a cross-sectional side elevation view of the illuminator of FIG. 1, showing the beam emitted by the SWIR laser and the beam conditioning optics applied.

Further, while illuminator housing 112 is shown and described as providing space for two SWIR lasers 102, defocused lens collimators 104, circular beam shaping diffusers 106, second beam shaping diffusers 108, circuit boards 116, and bandpass filters 110, those skilled in the art will readily appreciate that there can be any suitable number of SWIR lasers 102, defocused lens collimators 104, circular beam shaping diffusers 106, second beam shaping diffusers 108, circuit boards 116 and bandpass filters 110, in a single illuminator housing 112 for producing one or more respective beams 111, shown in FIG. 2. Those skilled in the art will also readily appreciate that illuminator 100 can also include a controller 118 and circuit board 116 for controlling the function of SWIR laser 102. It is contemplated the controller 118 and/or circuit board 116 can control one or more SWIR lasers.

Now with reference to FIG. 2, defocused lens collimator 104 is optically coupled to SWIR laser 102 within a laser housing 120 for diverging a beam 101 emitted by SWIR laser 102. Defocused lens collimator 104, e.g. a defocused fast-axis lens collimator, is configured to shape the beam of SWIR laser 102 into an eight degree divergence. Those skilled in the art will readily appreciate that lens collimator 104 is purposely defocused to create this diverging beam. Circular beam shaping diffuser 106 is optically coupled to defocused lens collimator 104 to diffuse a diverging semicircular beam 103 produced by defocused lens collimator 104 by 5 degrees producing a diffused beam 105. Second beam shaping diffuser 108 is optically coupled to circular beam shaping diffuser 106 to further diffuse diffused beam 105 produced by circular beam shaping diffuser 106 to create the illumination field and Gaussian distribution profile described above.

With continued reference to FIG. 2, bandpass filter 110 is optically connected to second beam shaping diffuser 108 configured to filter the emissions of a further diffused beam 107 produced by second beam shaping diffuser 108. Bandpass filter 110 is a 1550 nm bandpass filter configured to filter out all other emissions from further diffused beam 107, resulting in SWIR illuminator beam 111. Those skilled in the art will readily appreciate the bandpass filter 110 can pass a FWHM (Full-Width-Half-Maximum) bandwidth of about 100 nm, to provide for laser energy at 1550 nm to pass out of illuminator housing 112, while wavelengths that may exist outside of the intended band are filtered out and are largely prevented from leaving illuminator housing 112. Further, it is contemplated that bandpass filter 110 can block all radiation below 1.3 microns.

Figure 3:
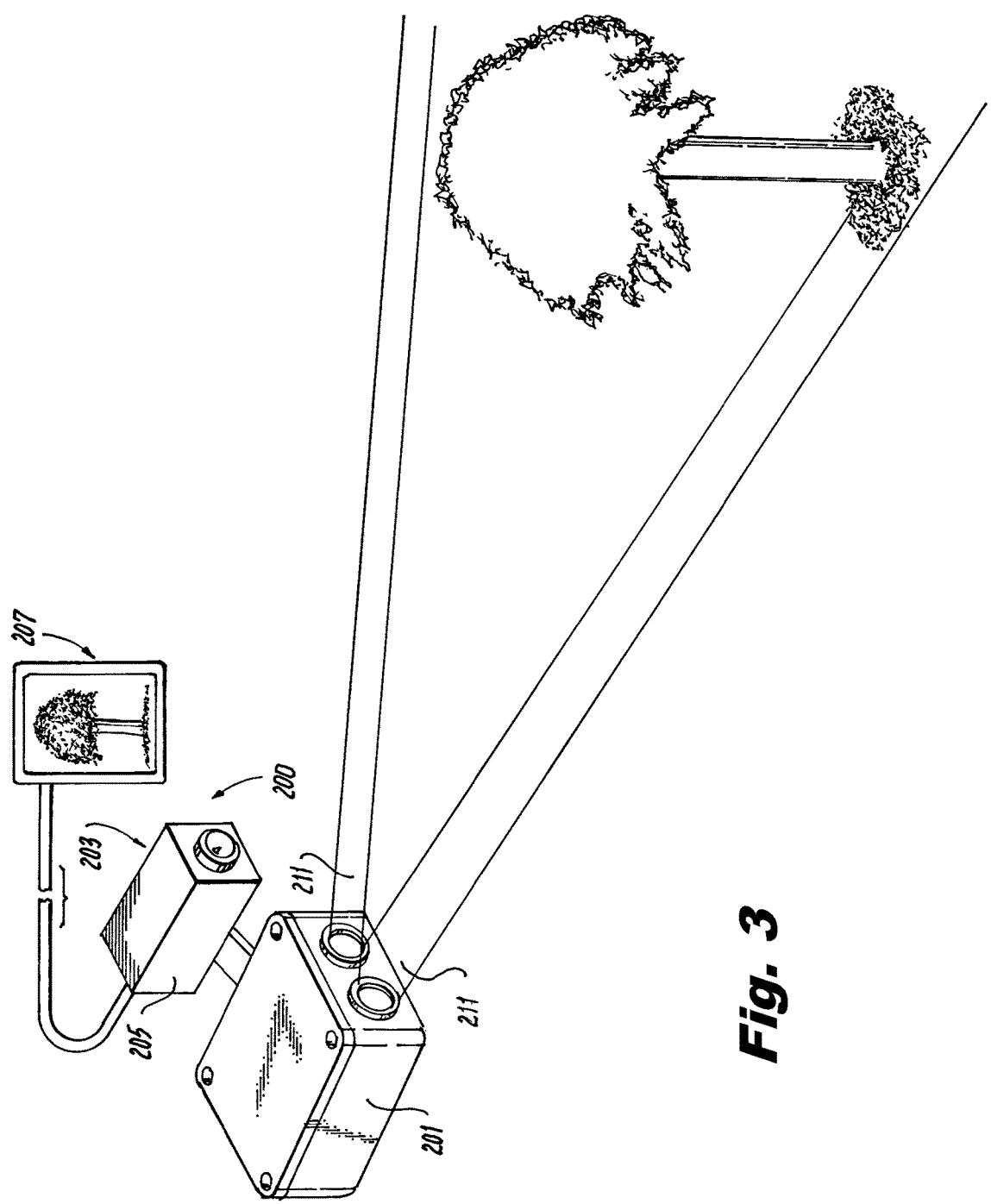
FIG. 3 is a perspective view of an exemplary embodiment of an imaging system constructed in accordance with the present disclosure, showing the illuminator of FIG. 1 and an imager.

As shown in FIG. 3, a SWIR imaging system 200 includes an illuminator 201, similar to illuminator 100, as described above, and an imager 203. Illuminator 201 includes two SWIR lasers, two defocused lens collimators, two circular beam shaping diffusers, two second beam shaping diffusers, and two bandpass filters in a single illuminator housing to create two respective SWIR illuminator beams 211. Those skilled in the art will readily appreciate that multiple beams 211 can provide a brighter field of illumination. Imager 203 has a SWIR sensor 205 configured to form an image of an object, e.g. the tree shown in FIG. 3, illuminated by the 1550 nm beams 211 emitted by illuminator 201. The image can be used in a monitoring system, e.g. a security monitoring system, or optionally be displayed on a display 207, e.g. a display found in a vehicle. Those skilled in the art will readily appreciate that SWIR imaging system 200 is a more compact imaging system than traditional LED imaging systems. It is contemplated that SWIR imaging system 200 can be used for vision enhancement in a variety of vehicles, such as, boats, aircrafts, and automobiles. It is also contemplated that SWIR imaging system 200 can be used in a variety of other devices, such as, security monitoring systems.

While illuminators 100 and 200 are shown and described above as having two SWIR lasers 102, defocused lens collimators 104, circular beam shaping diffusers 106, second beam shaping diffusers 108, circuit boards 116 and bandpass filters 110, those skilled in the art will readily appreciate that there can be any suitable number of SWIR lasers 102, defocused lens collimators 104, circular beam shaping diffusers 106, second beam shaping diffusers 108, circuit boards 116 and bandpass filters 110 in a single illuminator housing 112 for producing a single beam, and/or multiple respective beams.

The methods and systems of the present disclosure, as described above and shown in the drawings, provide for illuminators and SWIR imaging systems with superior properties including improved efficiency, compact size, and reduced foreground backscatter. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:
1. An illuminator comprising:
a short wave infrared (SWIR) laser;
a fast-axis lens collimator optically coupled to the laser for collimating a beam emitted by the laser;
a first beam shaping diffuser optically coupled to the lens collimator to diffuse a diverged beam produced by the lens collimator, wherein the first beam shaping diffuser is a circular beam shaping diffuser;
a second beam shaping diffuser optically coupled to the first beam shaping diffuser to further diffuse a diffused beam produced by the first beam shaping diffuser, wherein the second beam shaping diffuser is configured to create an illumination field with a Gaussian distribution centered in the horizontal plane of the illumination field; and
a bandpass filter optically connected to the second beam shaping diffuser configured to filter the emissions of a further diffused beam produced by the second beam shaping diffuser.
2. An illuminator as recited in claim 1, wherein the SWIR laser is a 1550 nm SWIR laser.
3. An illuminator as recited in claim 1, wherein the SWIR laser is an edge emitting SWIR laser.

4. An illuminator as recited in claim 1, wherein the lens collimator is a defocused fast-axis collimator lens configured to shape the beam of the SWIR laser into an eight degree divergence.

5. An illuminator as recited in claim 1, wherein the first beam shaping diffuser is a 5 degree circular beam shaping diffuser.

6. An illuminator as recited in claim 1, wherein the second beam shaping diffuser is configured to create a 90 degree horizontal by 40 degree vertical elliptical illumination field with a Gaussian distribution centered in the horizontal plane.

7. An illuminator as recited in claim 1, wherein the bandpass filter is a 1550 nm bandpass filter configured to filter out all other wavelength emissions from the further diffused beam.

8. An illuminator as recited in claim 1, further comprising an illuminator housing wherein the SWIR laser, the lens collimator, the first beam shaping diffuser and the second beam shaping diffuser are mounted within the illuminator housing and the bandpass filter is mounted within a wall of the illuminator housing.

9. A SWIR imaging system comprising:
- an illuminator including a short wave infrared (SWIR) laser, a fast-axis lens collimator optically coupled to the laser for collimating a beam emitted by the laser, a first beam shaping diffuser optically coupled to the lens collimator to diffuse a diverged beam produced by the lens collimator, wherein the first beam shaping diffuser is a circular beam shaping diffuser, a second beam shaping diffuser optically coupled to the first beam shaping diffuser to further diffuse a diffused beam produced by the first beam shaping diffuser, wherein the second beam shaping diffuser is configured to create an illumination field with a Gaussian distribution centered in the horizontal plane of the illumination field, and
- a bandpass filter optically connected to the second beam shaping diffuser configured to filter the emissions of a further diffused beam produced by the second beam shaping diffuser; and
- an imager with a SWIR sensor configured to form an image of objects illuminated by the illuminator.

10. A SWIR imaging system as recited in claim 9, wherein the SWIR laser is 1550 nm SWIR laser.

11. A SWIR imaging system as recited in claim 9, wherein the SWIR laser is an edge emitting SWIR laser.

12. A SWIR imaging system as recited in claim 9, wherein the lens collimator is a defocused fast-axis collimator lens configured to shape the beam of the SWIR laser into an eight degree divergence.

13. A SWIR imaging system as recited in claim 9, wherein the first beam shaping diffuser is a 5 degree circular beam shaping diffuser.

14. A SWIR imaging system as recited in claim 9, wherein the second beam shaping diffuser is configured to create a 90 degree horizontal by 40 degree vertical elliptical illumination field with a Gaussian distribution centered in the horizontal plane.

15. A SWIR imaging system as recited in claim 9, wherein the bandpass filter is a 1550 nm bandpass filter configured to filter out all other wavelength emissions from the further diffused beam.

* * * * *